(12) United States Patent
Gudesen et al.

(10) Patent No.: US 6,236,587 B1
(45) Date of Patent: May 22, 2001

(54) READ-ONLY MEMORY AND READ-ONLY MEMORY DEVICES

(76) Inventors: Hans Gude Gudesen, Tyrihansvein 5, N-1639, Gamle Fredrikstad; Per-Erik Nordal, Båstradryggen 19, N-1370, Asker; Geirr I. Leistad, Johnsstubben 19, N-1300, Sandvika, all of (NO)

( * ) Notice: Subject to any disclaimer, the term of this patent is extended or adjusted under 35 U.S.C. 154(b) by 0 days.

(21) Appl. No.: 09/297,467
(22) PCT Filed: Aug. 28, 1998
(86) PCT No.: PCT/NO98/00264
    § 371 Date: Sep. 13, 1999
    § 102(e) Date: Sep. 13, 1999
(87) PCT Pub. No.: WO99/14763
    PCT Pub. Date: Mar. 25, 1999

(30) Foreign Application Priority Data

Sep. 1, 1997 (NO) .................................................. 973993

(51) Int. Cl.[7] .................................................. G11C 17/06
(52) U.S. Cl. .................................................. 365/105; 365/100
(58) Field of Search .................................................. 365/105, 100, 365/175, 115, 94

(56) References Cited

U.S. PATENT DOCUMENTS

| | | | |
|---|---|---|---|
| 4,425,379 | * 1/1984 | Vora et al. | 427/84 |
| 4,442,507 | * 4/1984 | Roesner | 365/100 |
| 4,516,223 | * 5/1985 | Erickson | 365/175 |
| 4,569,120 | * 2/1986 | Stacy et al. | 29/574 |
| 4,575,743 | * 3/1986 | Hashimoto | 357/23.12 |
| 4,598,386 | * 7/1986 | Roesner et al. | 365/105 |
| 4,677,742 | * 7/1987 | Johnson | 29/591 |
| 4,884,238 | * 11/1989 | Lee et al. | 365/105 |
| 5,166,901 | * 11/1992 | Shaw et al. | 365/105 |
| 5,170,227 | 12/1992 | Kaneko et al. | 257/67 |
| 5,257,224 | * 10/1993 | Nojiri et al. | 365/175 |
| 5,272,370 | 12/1993 | French | 257/353 |
| 5,375,085 | 12/1994 | Gnade et al. | 365/145 |
| 5,379,250 | * 1/1995 | Harshfield | 365/105 |
| 5,464,989 | 11/1995 | Mori et al. | 257/30 |
| 5,811,337 | 9/1998 | Wen | 438/275 |
| 5,905,670 | * 5/1999 | Babson et al. | 365/105 |
| 5,952,671 | * 9/1999 | Reinberg et al. | 257/3 |

FOREIGN PATENT DOCUMENTS

WO 96/41381    12/1996    (WO) .

* cited by examiner

*Primary Examiner*—Son T. Dinh
*Assistant Examiner*—Anh Phung
(74) *Attorney, Agent, or Firm*—Brinks Hofer Gilson & Lione

(57) ABSTRACT

A read-only memory is made electrically addressable over a passive conductor matrix, wherein at least a portion of the volume between intersection of two conductors (2;4) in the matrix defines a memory cell (5) in the read-only memory. Data are stored as impedance values in the memory cells. The memory cells (5) comprise either an isolating material (6) which provides high impedance or one or more inorganic or organic semiconductors (9), preferably with an anisotropic conducting property. The semiconductor material (9) forms a diode junction at the interface to a metallic conductor (2;4) in the matrix. By suitable arrangement of respectively the isolating material (6) and semiconductor material (9) in the memory cells these may be given a determined impedance value which may be read electrically and corresponds to logical values in a binary or multi-valued code. The read-only memory device may be realized either as planar or also volumetrically by stacking several read-only memories (ROM) above each other and connecting them with the substrate (1) via addressing buses (14). Such read-only memory devices may be implemented on memory cards with standard card interfaces and used for storage of source information.

26 Claims, 9 Drawing Sheets

READ-ONLY MEMORY AND READ-ONLY MEMORY DEVICES

BACKGROUND OF THE INVENTION

The present invention concerns an electrically addressable, non-volatile read-only memory, comprising a plurality of memory cells which in a write operation comprising a part of the manufacturing process of the read-only memory, permanently each are assigned one or two or more logic states according to a determined protocol which in the memory defines permanently written or stored data, and a passive matrix of electrical conductors for the addressing, wherein the passive electrical conductor matrix comprises a first and a second electrode structure in respective mutually spaced apart and parallel planes and with parallel electrodes in each plane and provided such that the electrodes form a substantially orthogonal x,y matrix wherein the electrodes in the first electrode structure comprise the columns of the matrix or x electrodes and the electrodes in the second electrode structure comprise the rows of the matrix or y electrodes, wherein at least a portion of the volume between the intersection of an x electrode and a y electrode defines a memory cell in the read-only memory, wherein a contact area in the memory cell is defined by the portions which respectively extend along each side edge of the y electrode where it overlaps the x electrode in the memory cell, wherein are provided at least one semiconductor material with rectifying properties in relation to a selected electrical conducting electrode material, and a first electrical isolating material, and wherein the semiconductor material in electrical contact with an electrode in the memory cell forms a diode junction in the interface between semiconductor material and electrode material.

The invention also concerns a read-only memory device which comprises one or more read-only memories according to the invention, and a read-only memory device which comprises two or more read-only memories according to the invention.

FIELD OF THE INVENTION

Matrix addressing of data storage locations or bit spots on a plane is a simple and efficient way of achieving a great number of accessible memory locations with a moderate number of electrical addressing lines. In a square x,y matrix with n lines respectively both in the x direction and the y direction the number of memory locations scales as $n^2$. In one form or another this basic principle is at present implemented in a large number of different embodiments of solid state memory means. In these the memory location comprises a simple electronic circuit which communicates to the outside via the intersection in the matrix and a memory element, typically a charge storage device. Even if such means have been technically and commercially very successful, they have a number of disadvantages, and particularly each memory location has a complex architecture which leads to increased costs and reduced data storage density. In the large subclass of so-called volatile memory means the circuits must constantly sustain a current supply with accompanying heating and consumption of electric power in order to maintain the stored information. On the other hand non-volatile means avoid this problem, but with the trade-off of a reduced access and switching time as well as increased consumption and high complexity.

Prior art provides a number of examples of semiconductor-based read-only memories with electrical addressing in passive matrix. Thus U.S. Pat. No. 4,099,260 (Lynes et al.) discloses a semiconductor-based read-only memory (ROM) made as a large scale integrated device wherein self-isolating bit line surface areas of one conduction type are formed in a semiconductor substrate and directly in a bulk area in the opposite conduction type. Channel stop areas of the same conduction type as the bulk area are formed in the intervals between the bit line areas. Metallic word lines which lie above and are orthogonal to the bit line areas are formed separately from these by means of an isolating layer. The memory cell comprises a single Schottky diode. A diode of this kind will be formed or not at each intersection between a word line and a bit line depending on whether or not an opening is formed in the isolating layer during manufacturing in order to permit the word line to contact a lightly doped portion of the bit line. A ROM of this kind is stated to have a small area, high speed, low power dissipation and low cost.

Further there are from U.S. Pat. No. 4,000,713 (Bauge & Mollier) known a device with semiconductor elements, such as Schottky diodes and transistors integrated in the form of a matrix on chips. The matrix may be custom designed in order to provide a desired function. For instance it may be used as AND or OR matrices in programmable logic arrays (PLA) or as read-only memories which are stated to have better properties with regard to storage density and power dissipation. A first electrode structure with parallel metal electrodes of somewhat different design is provided on a semiconductor substrate of for instance the p type. An oxide layer is provided on a semiconductor substrate and openings are formed in the oxide layer to provide anode contacts and cathode contacts via metallic lines which constitute a first metal level in the electrode matrix. Two $n^-$ areas are located under the cathode contacts. These areas extend to underlying collector layers such that a Schottky diode is formed. Above the first metal level or electrode level an isolating layer is provided and over this a second metal level which comprises for instance an orthogonal second electrode structure. Openings through the isolating layer ensure contact with a cathode contact in a group of such which are included in the separate element in the matrix.

Finally there are from U.S. Pat. No. 5,272,370 (French) known a thin-film ROM device based on a matrix of open and closed memory cells formed in a stack of thin films on glass or another substrate. Each closed memory cell comprises a thin-film diode and it may by using stacks of semiconductor films, for instance of hydrogenated amorphous silicon, wherein the separate films are of different conduction types, be obtained diodes with different conduction characteristics. Thereby the information content in the ROM matrix may be increased. Each memory element which is formed with diode structure may then be set with different logic levels according to some manufacturing protocol. Where the memory element does not have a diode structure or where the semiconductors are covered by an isolating layer such that no electrode contact is formed, the memory element may be used to form a determined first logic level, for instance logical 0.

Even though the above-mentioned prior-art devices all realize electrical addressing in passive matrix in an as per se known manner by providing diode junctions in closed electrode contacts, they have partly due to using different types of semiconductors a relatively high degree of complexity. In the ROM device as disclosed in the last-mentioned publication (U.S. Pat. No. 5,272,370) it may, however, be possible to store more than two logical values in the matrix, but this presupposes use of different diode types and hence several layers of differently doped semiconductors in the bit spot with diode junction.

The object of the present invention is hence primarily to provide a read-only memory or ROM which permits electrical addressing in passive matrix to the separate memory cell in the read-only memory and which does not need refreshment in order to keep the data stored in the memory cell, while the read-only memory shall be simply and cheaply realized using as per se known technologies and methods as applied in the semiconductor and thin-film technology.

Particularly it is the object of the present invention to provide a non-volatile read-only memory based on the use of organic materials, for instance polymer materials, which realized in thin-film technology may be used both in conductors, isolators and semiconductor materials, something which supposedly shall provide more flexible technical solutions and especially a much reduced cost than would be the case when using crystalline inorganic semiconductors.

Further it is also an object to provide a read-only memory which allows a multilevel coding of predetermined memory cells or memory locations.

Finally it is the object of the present invention to provide a read-only memory may be used to realize a volumetric read-only memory device.

These and other objects and advantages are achieved according to the invention with a read-only memory which is characterized in that the y electrodes are provided on a second electrical isolating material which is realized as strip-like structures of substantially same form and extension as the y electrodes and provided adjacent to the x electrodes as part of the matrix, that the semiconductor material is provided over the electrode structures, that a first logic state of a memory cell in the read-only memory is generated by an active portion of the semiconductor material covering the whole contact area in the memory cell, the diode junction comprising the whole contact area of the memory cell, that a second logic state in a selected memory cell in the read-only memory is generated by both electrode structures in the memory cell being covered by the first isolating material, that one or more additional logic states in a memory cell in the read-only memory is generated by an active portion of the semiconductor material covering only a part of the contact area, such that the data which are stored in the memory may be represented by the logic states in a binary or multi-valued code, and that a logic state in each case is given by the impedance value of the memory cell, said impedance value substantially being given by one or more of the following factors: the impedance characteristics of the semiconductor material, the impedance characteristics of the isolating material, the extension of the active portion of the semiconductor material, the extension of the part of the contact area which forms the diode junction, and the impedance characteristic of the diode junction.

SUMMARY OF THE INVENTION

A first read-only memory device according to the invention is characterized in that the read-only memory is provided on a substrate of semiconductor material or between substrates of semiconductor material and via the substrates connected with driver and control circuits for driving and addressing, said driving and control circuits being integrated in the substrate or the substrates and realized in a semiconductor technology compatible with the substrate material; and a second read-only memory device according to the invention is characterized in that the read-only memory is stacked in horizontal layers in order to provide a volumetric memory device, that the volumetric memory device is provided on a substrate of semiconductor material or between substrates of semiconductor material and via the substrate or the substrates connected with driver and control circuits for driving and addressing, said driving and control circuits being integrated with the substrate or the substrates and realized in a semiconductor technology compatible with the substrate material.

Wherein the read-only memory according to the invention constitutes a binary logic memory with only one additional logic state, it is advantageous the first logic state which either represents a logical 0 or a logical 1, is given by the effective forward bias resistance of a diode formed in a memory cell wherein the semiconductor material contacts both the x electrode and the y electrode, and that the additional logic state which correspondingly represents either a logical 1 or a logical 0, is given by a selected resistance value for the first isolating material provided in a memory cell wherein the semiconductor material does not contact either the x electrode or the y electrode, said isolating material in a memory cell preferably having an infinite resistance value.

Wherein the read-only memory according to the invention is realized as a multilevel logic memory with two or more additional logic states, it is advantageous that the first logic state is given by the effective forward bias resistance of a diode formed in a memory cell wherein the semiconductor material contacts both the x and y electrodes and that the additional logic states are given by determined resistance values for the isolating material provided in a memory cell wherein the semiconductor material at most contacts either the x electrode or the y electrode and the selected determined resistance value in each case lies between the effective forward bias resistance of a memory cell formed in the diode, and infinite.

In a first embodiment of the read-only memory according to the invention the first isolating material in selected memory cells is provided over the electrode structures in the form of a separate layer-like isolator patch which wholly or partly covers the electrodes in the memory cell, a selected memory cell dependent on the active portion of the semiconductor material and/or the diode junction area in the latter case acquiring a logic state which corresponds to a level in a multi-valued code. Preferably the semiconductor material in this embodiment may be provided over the electrode structures in a global layer and besides over the isolator patch in the selected memory cells, or alternatively be provided over the electrode structures and adjacent to the isolator patch in the selected memory cells, such that semiconductor material and the isolator patches mutually flush in a common continuous layer.

In a second embodiment of the read-only memory according to the invention the first isolating material is provided over the electrode structures in the form of a substantially global layer, and with removed portions in selected memory cells, such that the removed portion wholly or partly exposes the electrodes in a selected memory cell, said memory cell dependent on the active portion of the semiconductor material and/or the diode junction area in the latter case acquiring a logic state which corresponds to a level in a multi-valued code. Preferably the semiconductor material in this embodiment may be provided over the electrode structures and over the isolating layer in a global layer and besides contact the electrode structures in the removed portions of the isolating layer, or alternatively be provided over electrode structures and adjacent to the isolating layer in the selected memory cells, such that the semiconductor material and the isolating layer mutually flush in a common continuous layer.

In a third embodiment of the read-only memory according to the invention the semiconductor material in selected memory cells is provided over the electrode structures in the form of a separate layer-like semiconductor patch which wholly or partly covers the electrodes in the cells, a selected memory cell dependent on the active portion of the semiconductor material and/or the diode junction area in the latter case requiring a logic state which corresponds to a level in the multivalued code. Preferably the first isolating material in this embodiment may be provided over the electrode structures in a global layer and besides over the semiconductor patches in the selected memory cells, or alternatively be provided over the electrode structures and adjacent to the semiconductor patch in the selected memory cells, such that the first isolating material and the semiconductor patches mutually flush in a common continuous layer.

In a fourth embodiment of the read-only memory according to the invention the semiconductor material is provided over the electrode structures in the form of a substantially global layer and with removed portions in selected memory cells, such that the removed portions wholly or partly exposes the electrodes in a selected memory cell, said memory cell dependent on the active portion of the semiconductor material and/or the diode junction area in the latter case acquiring a logic state which corresponds to a level in a multivalued code. Preferably the first isolating material in this embodiment may be provided over the electrode structures and the semiconductor material in a global layer and besides isolate the electrode structures in the removed portions of the semiconductor layer, or alternatively be provided over the electrode structures and adjacent to the semiconductor layer in the selected memory cells, such that the first isolating material and the semiconductor layer mutually flush in a common continuous layer.

Finally it is according to the invention advantageous that the semiconductor material is amorphous silicon, polycrystalline silicon or an organic semiconductor, the organic semiconductor preferably being a conjugated polymer.

According to the invention the semiconductor material may be an anisotropic conductor. Preferably the semiconductor material may comprise more than one semiconductor or possibly also be added or combined with an electrical conducting material.

Preferably the semiconductor material, the isolating material and the electrode structures are realized as thin films.

The background of the invention and various examples of its embodiment shall now be discussed in more detail in the following with the reference to the accompanying drawing.

DESCRIPTION OF THE ACCOMPANYING DRAWINGS

Figure 3:
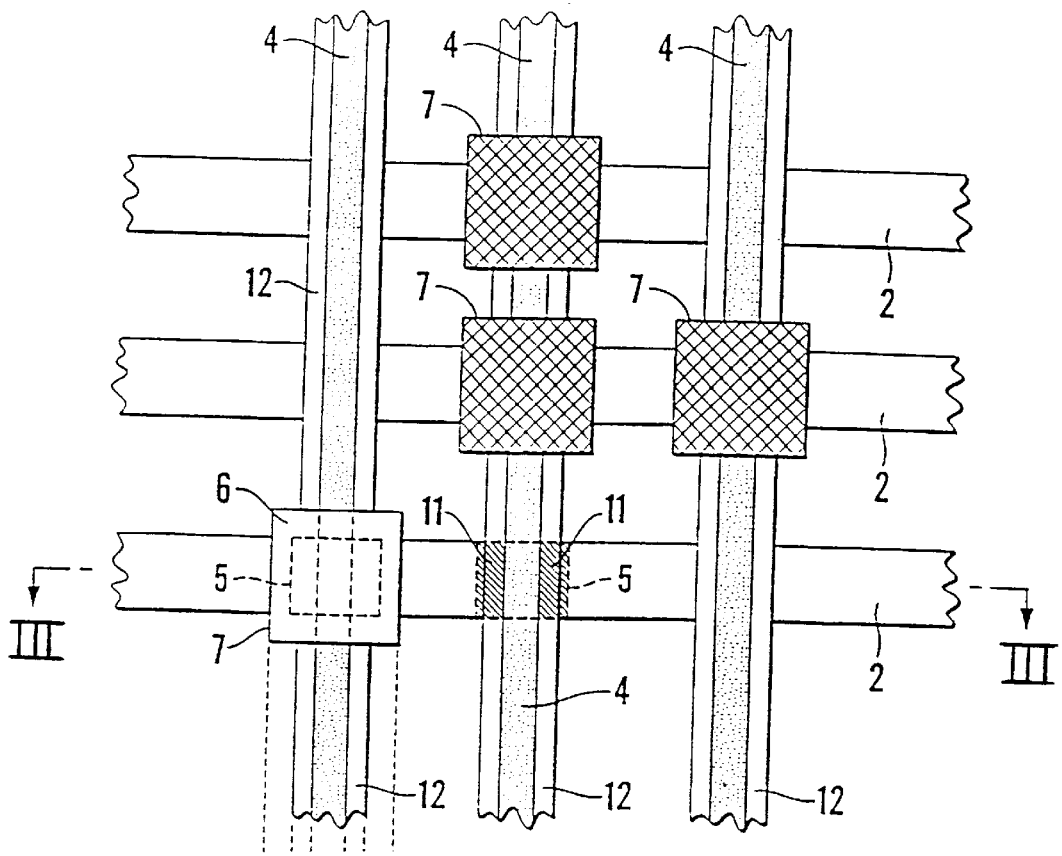
FIG. 3 is a plan view of a first embodiment of a read-only memory according to the invention.
Figure 3A:
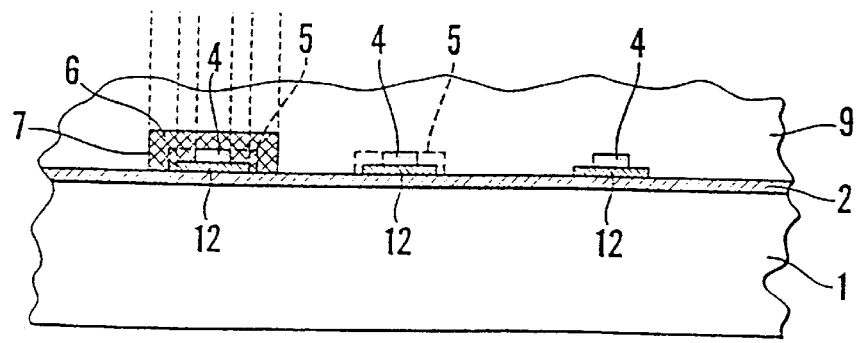
Figure 3B:
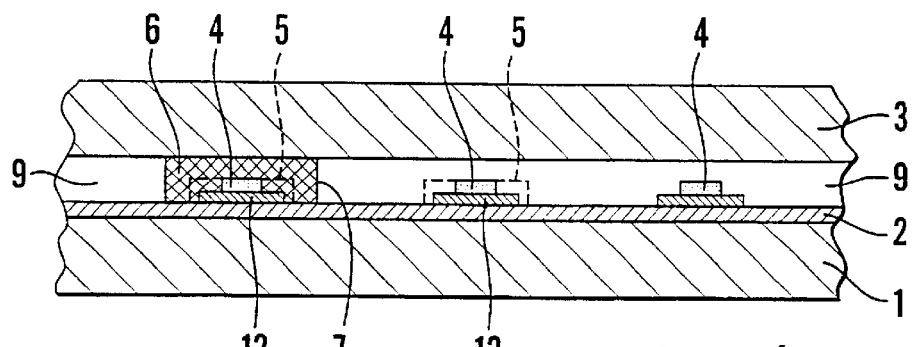
Figure 4B:
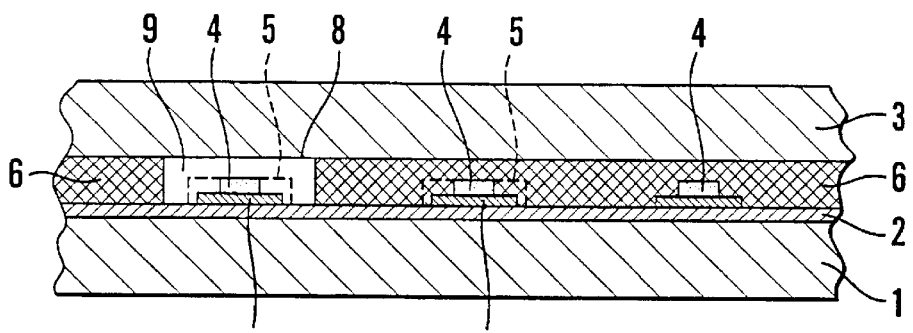
Figure 5B:
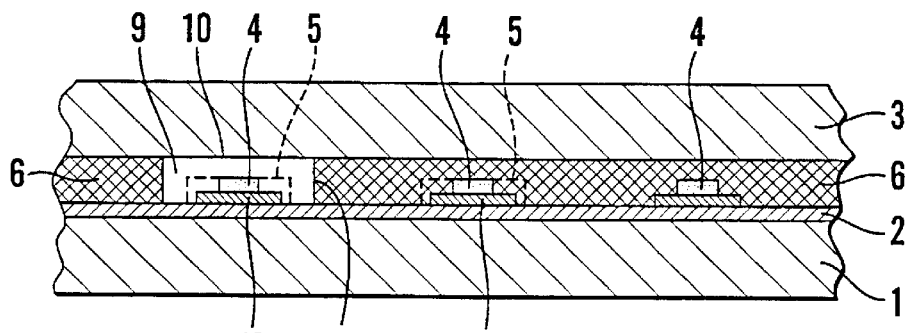
Figure 6B:
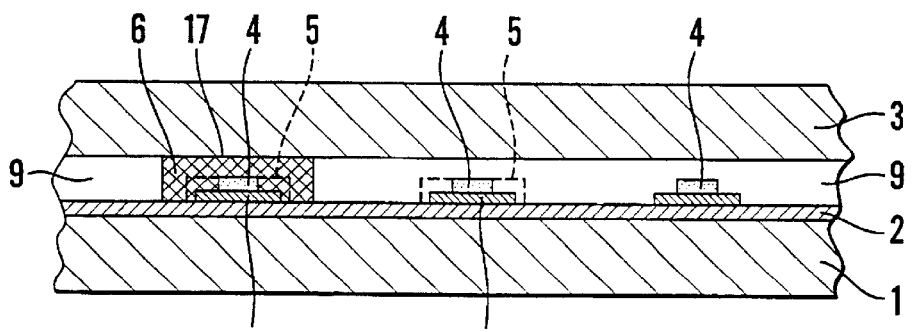
Figure 4:
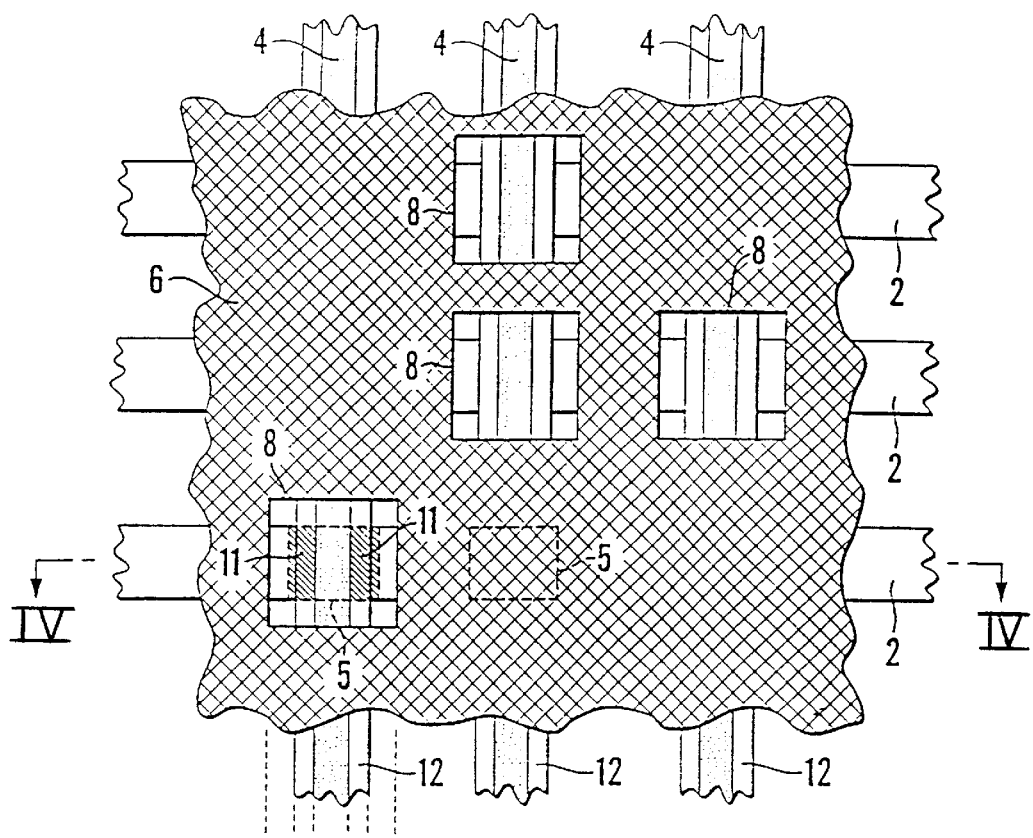
Figure 4A:
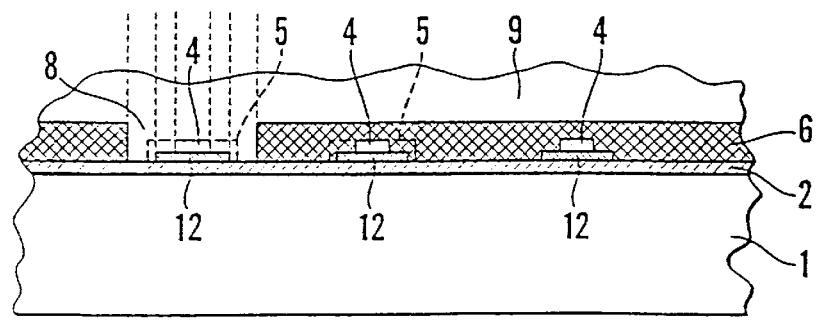
Figure 5:
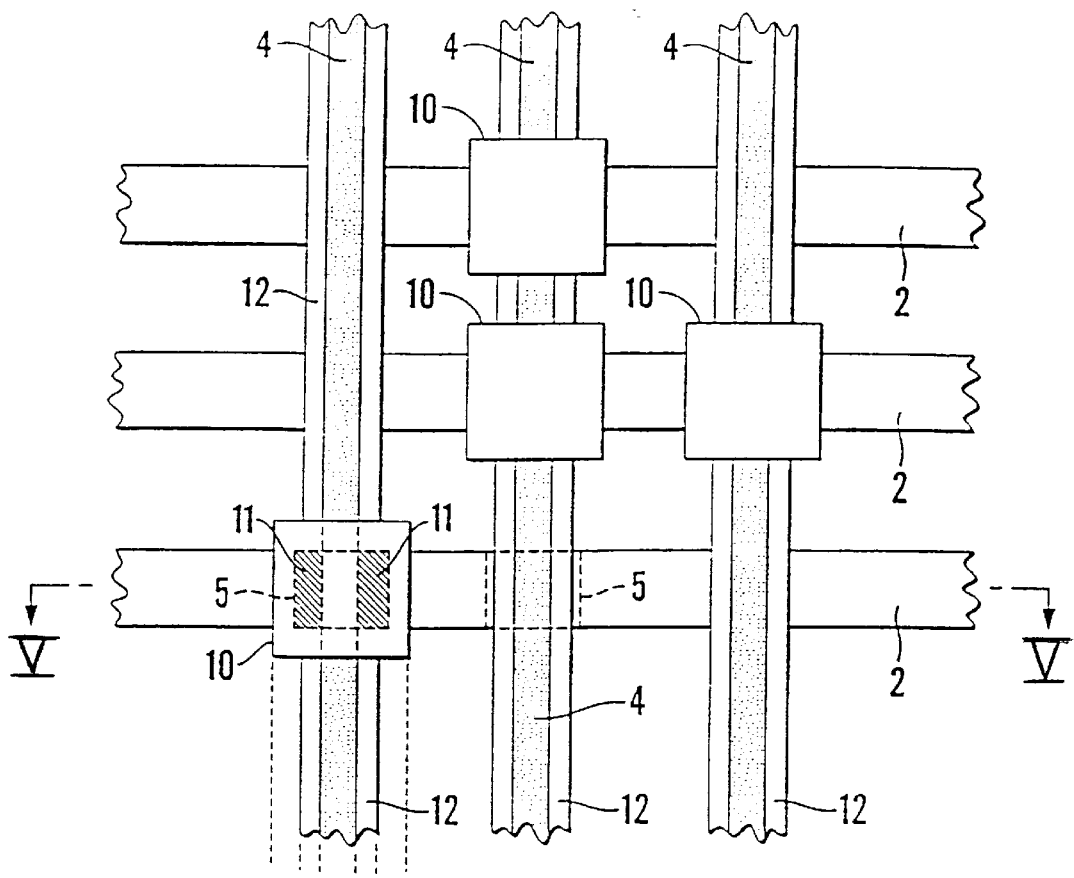
Figure 5A:
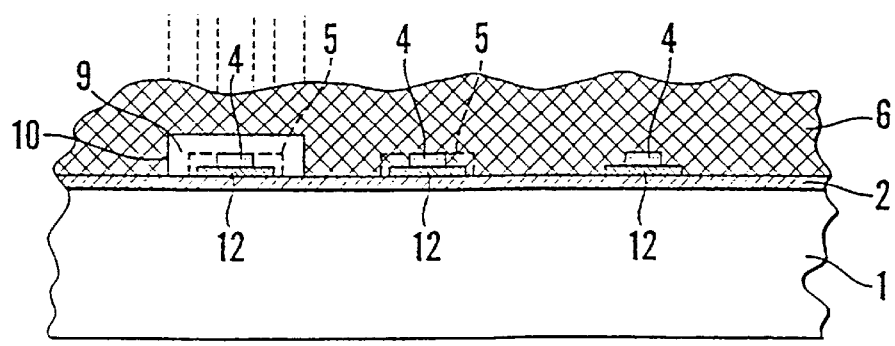
Figure 6:
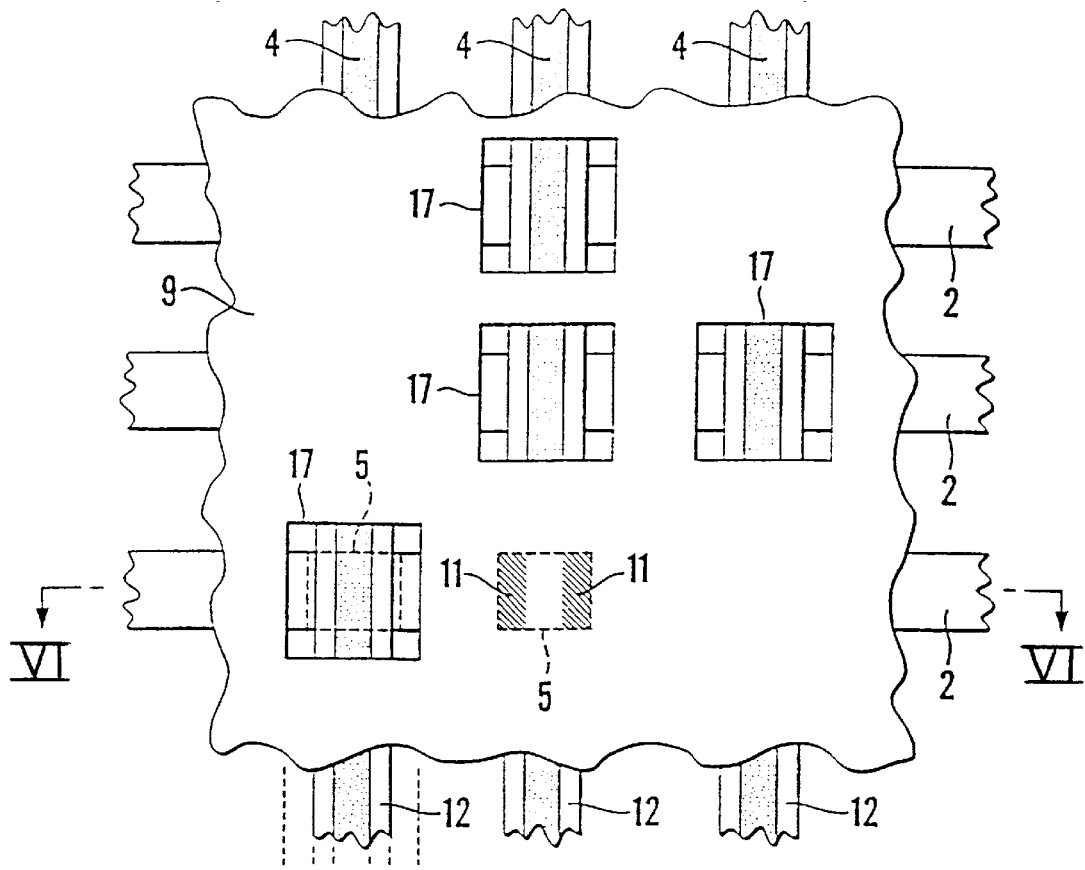
Figure 6A:
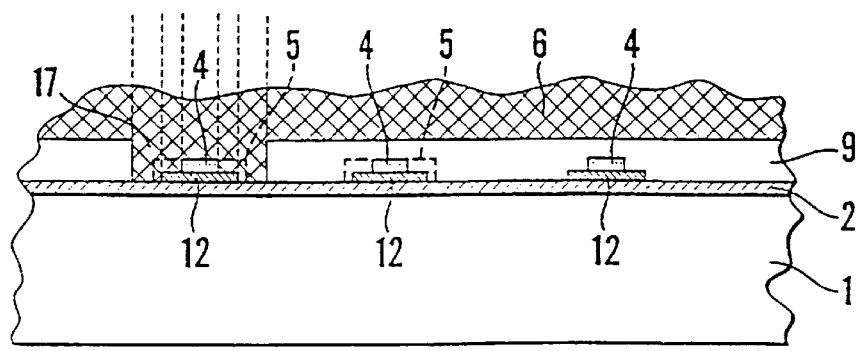
Figure 7A:
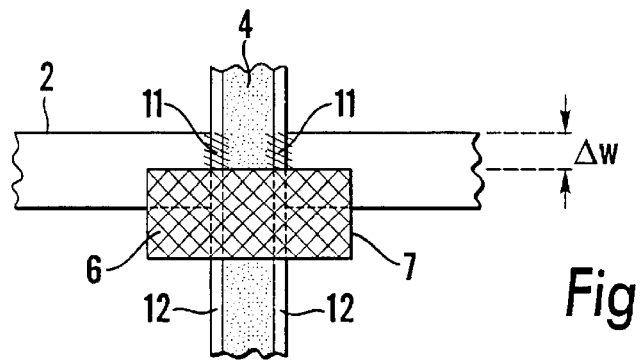
Figure 7B:
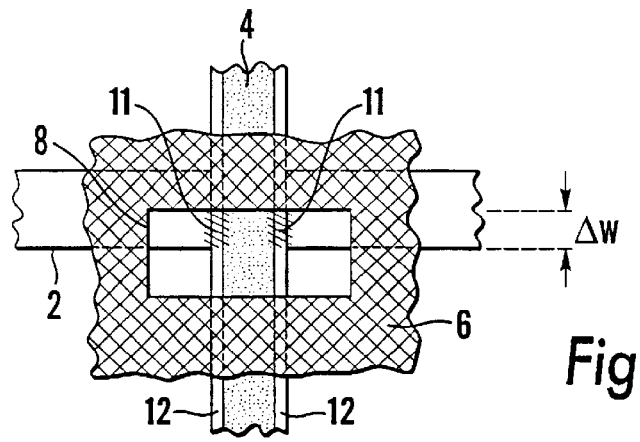
Figure 8A:
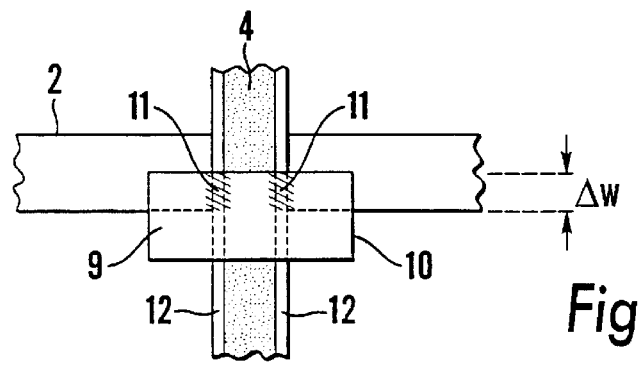
Figure 8B:
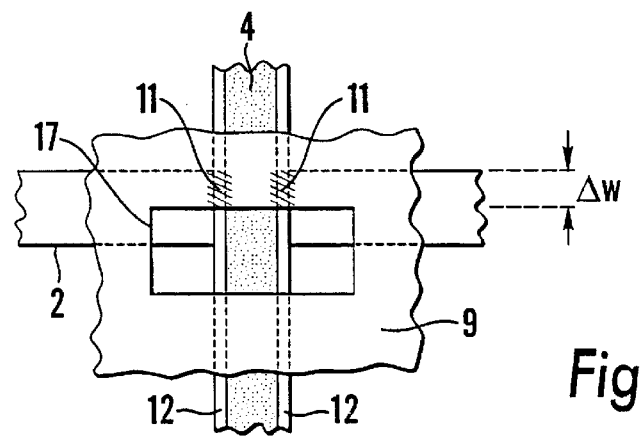
Figure 9:
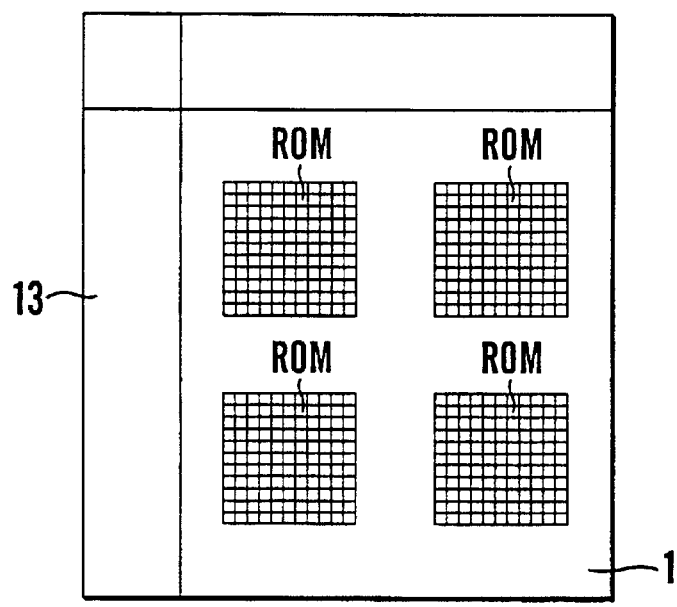
Figure 10:
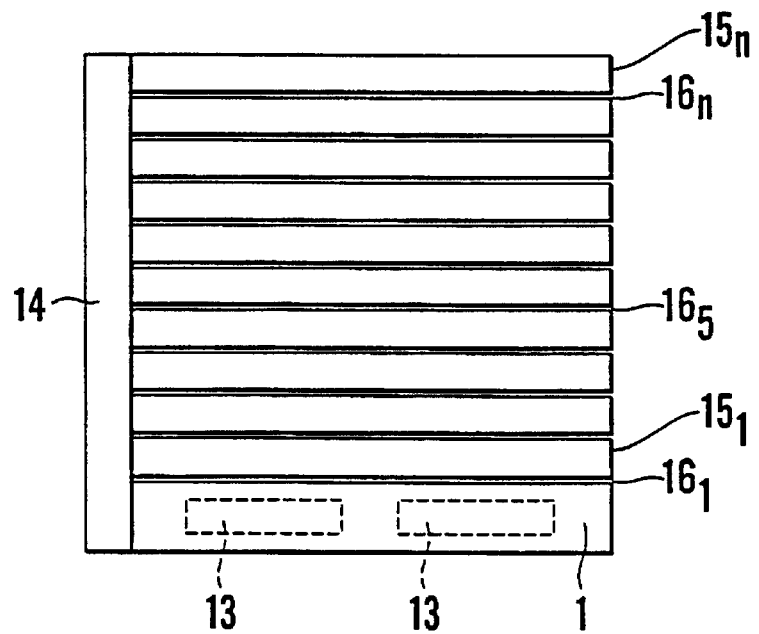

FIG. 3*a* is a section view of the read-only memory shown in FIG. 3 taken along the line III—III;

FIG. 3*b* is a sectional through the read-only memory in FIG. 3*a* taken along the line A—A in a second variant of this embodiment;

FIG. 4 is a plan view of another embodiment od a read-only memory according to the invention;

FIG. 4*a* is a section view of the read-only memory shown in FIG. 4 taken along the line IV—IV;

FIG. 4*b* is a section through the read-only memory in FIG. 4*a* taken along the line A—A in a second variant of this embodiment, FIG. 5 is a plan view of a third embodiment of a read-only memory according to the invention;

FIG. 5*a* is a section view of the read-only memory shown in FIG. 5 taken along the line V—V;

FIG. 5*b* is a section to the read-only memory in FIG. 5*a* taken along the line A—A in a second variant of this embodiment, FIG. 6 is a plan view of a fourth embodiment of a read-only memory according to the invention;

FIG. 6*a* is a section view of the read-only memory shown in FIG. 6 taken along the line VI—VI;

FIG. 6*b* is a section through the read-only memory in FIG. 4*a* taken along the line A—A in a second variant of the second embodiment, FIG. 7*a* is an example of multilevel coding of a memory cell in the embodiment in FIG. 3*a*, FIG. 7*b* is an example of multilevel coding of a memory cell in the embodiment in FIG. 4*a*, FIG. 8*a* is an example of multilevel coding of a memory cell in the embodiment in FIG. 5*a*, FIG. 8*b* is an example of multilevel coding of a memory cell in the embodiment in FIG. 6*a*, FIG. 9 is a section through a first read-only memory device according to the invention, and FIG. 10 a section through a second read-only memory device according to the invention.

DESCRIPTION OF THE PREFERRED EMBODIMENTS

Figure 1:
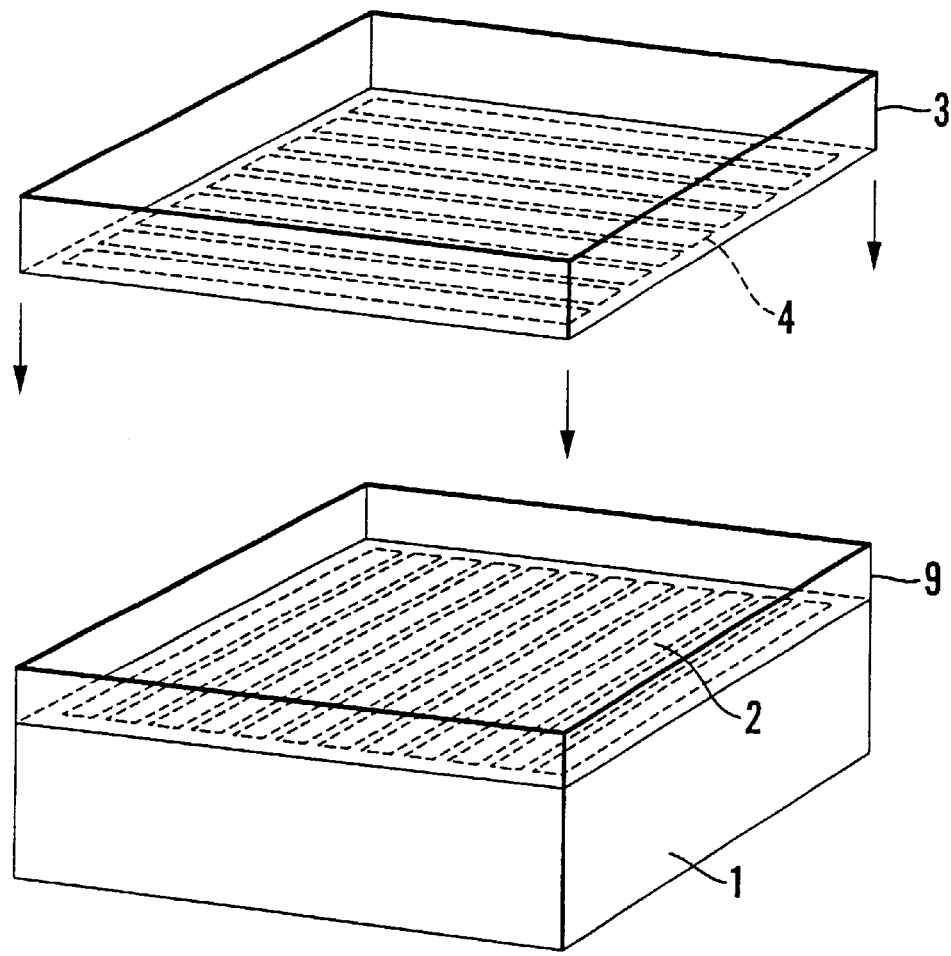
FIG. 1 shows schematically a general embodiment of a memory device with a passive electrode matrix provided between backplanes or substrates.

The general background of the invention shall now be discussed more closely. A generic matrix addressing system is shown in FIG. 1, wherein for instance m electrical conducting lines 2 are mutually spaced apart and extend in a x direction and with for instance n overlying electrical lines 4 which extend in a y direction and respectively form first and second electrode structures in an orthogonal x,y electrode matrix. The x electrodes 2 and the y electrodes 4 are provided sufficiently close to each other such that geometrically well-defined overlapping areas or intersections between the electrodes are provided. The volume near and between each intersection, coarsely defined by the overlapping area which is given by the width of the intersecting x electrodes and the y electrodes in these intersections, comprises what in the following will be denoted as a memory cell 5, see FIG. 2. The mutually overlapping areas of respectively the x and the y electrodes 2;4, in a memory cell 5 will be denoted as the contact area of the memory cell. According to the invention data is stored in each memory cell as impedance values, for instance resistance values between the x and the y electrode in each intersection. The logic state in each intersection or memory location is found by measuring electrical impedance between the x electrode and the y electrode which intersect each other in the memory cell.

Figure 2:
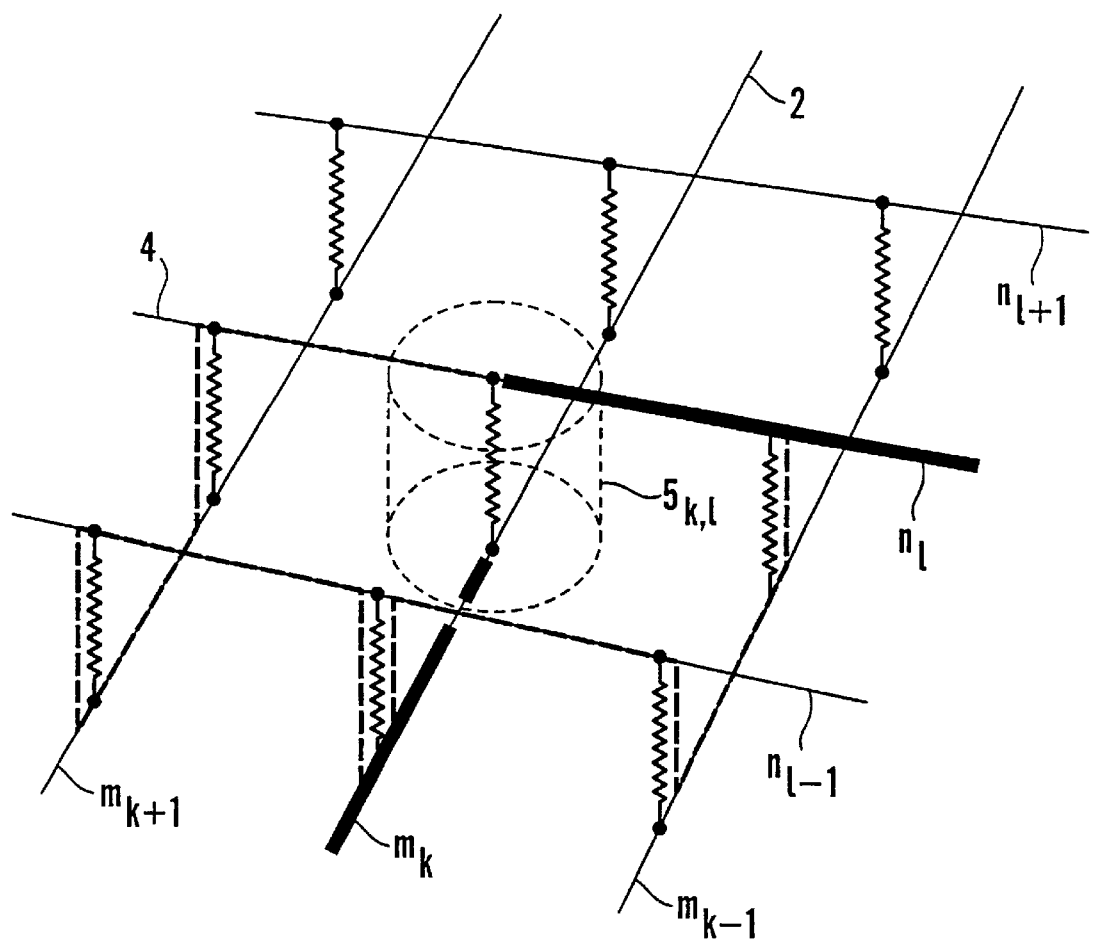
FIG. 2 shows schematic examples of sneak current loops which may arise in a matrix of this kind.

Distinct from common known current-addressed and matrix-based memory systems the present invention allows the use of a purely passive electrical addressing, as there are no discrete active circuit elements in the memory cells. It is well-known that the use of electronic memories with memory cells in passive matrix is encumbered with alternative current paths or sneak current paths in the electrode matrix. This problem is indicated in FIG. 2 where alternative current paths generated by addressing the memory cell $5_{kl}$ given by the intersection between the electrodes $m_k$, $n_j$ are indicated by thinner stitched lines to the neighbouring memory cells. When the size of the matrix, i.e. the product x·y increases, then the sneak current problem also amplifies. If the memory elements in each intersection has a purely resistive impedance this implicates that the resistance difference in a write operation will be masked by currents which leak through alternative current paths, such as indicated in FIG. 2. If the electrical connection in each intersection is given a highly non-linear current-voltage characteristic, the sneak current problem may be reduced or wholly eliminated. Quite simply this is achieved in a manner which is already well-known and suggested in the art, namely by providing a rectifying diode in series with the impedance or resistance in each intersection.

An essential goal of the present invention is forming a network of diodes of this kind in a manner which simple, cheap, reliable and which simultaneously allows the use of suitable memory structures in the form of controllable impedances. According to the present invention the x and the y electrodes may preferably surround a layer of semiconducting material, for instance in thin-film configuration. Particularly this semiconducting material may advantageously be a conjugated polymer of the tiophene or PPV-type. By choosing a suitable electrode material with regard to the semiconducting material, a diode junction is obtained at the electrode-semiconductor interface and the diode may be given very good rectifying properties. A simple linearized analysis shows that the number of electrode intersections, i.e. memory cells which may be addressed without distortion or noise due to sneak currents, is approximately equal to the diode rectification ratio in each intersection, i.e. the relation between forward and backwards flowing current at a given bias voltage.

Another basic problem with passive matrix memories as exemplified in FIG. 1 wherein the continuous material layer with finite resistance extends in the intervals between the intersections of the electrode matrix, is that currents even with perfect rectification in each intersection may flow between the electrode lines 2, 4 in these intervals. Even if the path length in these intervals will be much longer than which is the case in the intersections, i.e. in the memory cell, and the layer between the electrode structures are extremely thin with high surface resistance, the combined effect of many such current paths is detrimental to the measured impedance and hence finally sets an upper limit to the number of intersections and so also of memory cells which may be realized in a passive matrix.

The last kind of crosstalk may be avoided by making the film conductance highly anisotropic, i.e. with high conductance in the desired current direction and else low conductance. In case of FIG. 1 this will correspond to high conductance perpendicularly to the plane of the matrix and low conductance in the matrix plane. Polymer compositions with properties of this kind have been described in the literature, for instance in the paper "White light emission from a polymer blend light emitting diode" of M. Granström and O. Inganäs, Applied Physics Letters 68, 2:147–149 (1996), and electrode means and devices based thereon have been disclosed in Norway Patent Application No. 973390 which has been assigned to the present applicant.

Starting with an as per se known basic structure as shown in FIG. 1 wherein the x and y electrodes 2;4 are provided on each side of an anisotropic thin film with high rectification ratio in the intersections of the electrodes, data may be coded by a controlled deposition of an electrical isolating material between diodes in selected intersections, such this will be discussed in more detail in connection with FIG. 4. If such selected intersections are given an infinite resistance, each intersection or each memory cell can be binary coded, for instance with a forward bias voltage which either gives logical 1 as $R=R_F$, where $R_F$ is the effective forwards bias resistance of the diode in this intersection, or logic 0 as $R=\infty$, where an infinite resistance on purpose have been inserted in the intersection. Higher data storage capacity will be obtained by using a larger range of resistance values, which is equivalent to several bits being stored in each memory cell, for instance with resistance values $R_1$, $R_2$, $R_3$, ..., $R_F<R_1<R_2<R_3<\infty$.

There shall now with reference to FIGS. 3–8 be described examples of embodiments of the read-only memory according to the invention. In these embodiments it is used a particular addressing geometry which simplifies the adjustment tasks in the manufacture and offers a number of advantages. These embodiments differ from those which are described in a parallel and on the same date filed International application PCT/NO/9800263 with the same priority base as the present application, in that the semiconductor material and the isolating material is not provided between the electrode structures in a sandwich configuration, but instead provided over the electrode structures which are arranged in a bridge configuration such as for instance evident from FIG. 3a and FIG. 3b. Each of the y electrodes is here provided on strips 12 of an electrical isolating or dielectric material which substantially has the same form and extent as the y electrode 4 and rests on the x electrodes 2 provided orthogonally to the y electrodes 4, such that there is no physical or electrical contact between the x and y electrodes 2;4.

A first embodiment of the read-only memory according to the invention, wherein the electrodes 2,4 are provided in bridge configuration, is shown respectively in plan view and section in FIG. 3a. Over the memory cells 5 which is defined in the intersection between x and the y electrode 2;4 the data are coded by the first isolating material 6 in selecting memory cells being provided over the electrode structures as a separate layer-like isolator patch 7. The semiconductor material 9 is provided over the electrode structures with the electrodes 2,4 and the isolator patches 7 and will only contact the electrodes 2,4 in a memory cell 5 where the isolator patch 7 is not present. The contact area 11 is indicated by a patching on the side edges on a y electrode 4 in a memory cell 5 and the active area of the semiconductor material which in this case gives its impedance value, extends from the y electrode 4 through the semiconductor material 9 to contact with the x electrode 2. Preferably the semiconductor material which for the sake of clarity is deleted from the plan view in FIG. 3a, may be an anisotropic semiconducting material, but where for instance the distance between the memory cells is not very small, i.e. the storage density is low, the semiconductor material may well be an anisotropic conducting semiconductor material. In a variant of the embodiment in FIG. 3a the semiconductor material 9 is provided over the exposed electrodes 2,4, and adjacent to the isolator patches 7, such that the surface of the isolator patches 7 and the semiconductor material 9 mutually flush, as this is shown in FIG. 3b. Thereby the distance between the substrates 1,3 may be reduced and there is nothing against the electrode 4 resting against substrate 3 which, of course, is electrically isolating.

It will also be possible to employ a multilevel coding in the input of data which are to be stored in the read-only memory of the embodiment as shown in FIG. 3a, and this will be described in greater detail below in connection with FIG. 7a.

A second embodiment of the read-only memory according to the invention is shown in FIG. 3. Here the memory cells instead are coded by isolator patches 7 using a substantially global layer of an electrical isolating material 6 which is provided over the electrode structures, but with removed portions 8 in selected memory cells 5. A global semiconductor layer 9 is provided over the isolating layer 6 and will only contact the electrodes 2, 4 in the memory cells 5 at the removed portions 8 of the isolating layer 6. The contact areas 11 are formed in a corresponding manner as in the embodiment in FIG. 3a. Also in the plan view in FIG. 4, is the semiconductor layer 9 for the sake of clarity deleted. The semiconductor material 9 may also in the embodiment in FIG. 4a be provided only in the removed portions 8 such that its surface are flush with the surface of the isolating layer 6 as shown in FIG. 4b. The removed portions 8 will then form isolated memory cells 5, and the semiconductor material in these memory cells hence need not be an anisotropic semiconducting material, but may just as well have isotropic conducting properties as the semiconductor material does not form a continuous layer where blind currents or bulk currents may pass between the memory cells. Also here the y electrodes 4 may besides rest against an electrical isolating substrate 3. The surface of the y electrodes will then, of course, also be flush with the surfaces of the semiconductor material and the first isolating material. In the embodiment shown in FIG. 4 it is further possible to implement a multilevel coding, such this shall be discussed in greater detail below in connection with FIG. 7b.

A third embodiment of the read-only memory according to the invention is shown in FIG. 5. It differs from the two previous embodiments in that by the semiconductor material 9 being provided in the form of semiconductor patches 10 in selected memory cells 5, and coding for instance the first logical value, while the first isolating material 6 is provided over the semiconductor patches 10 and the open memory cells 5 in a substantially global layer. Also in the plan view in FIG. 5a this layer is for the sake of clarity deleted. The semiconductor patches 10 are mutually isolated by the isolating material 6 and may hence be anisotropic conducting semiconductor material, as blind currents or bulk currents between the memory cells 5 will not be present. The contact areas 11 define as before the active portion of the semiconductor patch, said active portion of course extending from the side edges of the y electrode and to contact with the underlying x electrode in the memory cell. Also in the embodiment in FIG. 5a the isolating material may be provided such that it is flush with the surface of the semiconductor patches 10 as shown in FIG. 5b, and the y electrodes 4 are resting against the substrate 3. Functionally and geometrically the embodiment in FIG. 5b does not differ from that in FIG. 4b, but in the embodiment in FIG. 4b the isolating layer 6 with the removed portions 8 is first deposited, while the semiconductor material 9 thereafter is deposited in the removed portions 8, for instance by first being provided as a global layer both over the isolating layer 6 and the removed portions 8 and thereafter scraped off such that it only will be present in the removed portions 8. In the variant embodiment in FIG. 5b the semiconductor material 9, however, first is deposited as semiconductor patches 10 and thereafter the isolating layer 6 is deposited substantially globally over the semiconductor patches 10 and the remaining open memory cells, whereafter it is scraped off until it is flush with a semiconductor patches 10 as shown in FIG. 5b.

Also in the embodiment in FIG. 5 multilevel coding may be used, such as will be discussed in greater detail below in connection with FIG. 8a.

A fourth embodiment of the read-only memory according to the invention is shown in FIG. 6. Here the semiconductor material 9 is deposited over the electrode structures as a substantially global layer but with removed portions or windows 17 in selected memory cells 5 such that a first logic state in binary coding is only obtained in the memory cells wherein the semiconductor material 9 is provided and the contact areas 11 are present, while another logic state is obtained in the memory cells which are located in a removed portion of the semiconductor material. Over the semiconductor material a first isolating material 6 is now deposited in a substantially global layer which for the sake of clarity, however, is deleted from the plan view in FIG. 6. Also here the isolating material may be deposited only in the removed portions 17 in the semiconductor material such that the surface of the isolating material 6 is flush with the surface of the semiconductor layer 9, as shown in FIG. 6b, while the y electrodes 4 simultaneously may well rest against the isolating substrate 3. It will easily be seen that the embodiment in FIG. 6b is geometrically and functionally analogue to that in FIG. 3b, as it is only the sequence of the arrangement of respectively the semiconductor material 9 and the isolating material 6 which differs.

Also in the embodiment in FIG. 6a it is possible to employ a multilevel coding as this will be described in greater detail in connection with FIG. 8b.

The embodiments in FIGS. 3–6 allow, as mentioned, a multilevel coding of data in preselected memory cells. In this case it is presupposed that a semiconductor material with anisotropic electrical conducting property is used, for instance in the form of a conjugated polymer. The semiconductor material will then contact respectively the x electrode and the y electrode in the contact areas 11 which respectively are located along the side edges of the y electrode where it intersects the x electrode. Each memory cells will hence comprise two contact areas and have active portions which extend through the semiconductor material and between the y electrode along each side edge thereof and to the x electrode over at least a part $\Delta w$ of the width w of the x electrode. A multilevel coding of data which are stored in a memory cell will now take place by adjusting the length of the contact area, such that the impedance value of the memory cell in question arrives between a maximum value, for instance infinite, and a value dependent of the diode forward bias voltage.

In practice this may be done by using an isolator patch 7 in the memory cell such that only a part of the x and the y electrodes 2;4 at the intersection of the electrodes in the memory cell is covered. Thereby a contact area is exposed to the not shown semiconductor material 9, such as is apparent from FIG. 7a which corresponds to the embodiment in FIG. 3, but with multilevel coding of preselected memory cells. FIG. 7b corresponds to the embodiment in FIG. 4 and differs from the embodiment in FIG. 7a in that the isolating material 6 is not provided in the form of patches 7, but as a global layer with removed portions or windows 8, wherein the not shown semiconductor material is provided and contacts the x and y electrodes 2;4 in the memory cell at the contact areas 11 which are located under the semiconductor material and along the side edges of the y electrode 4, such that the active portion of the semiconductor material contacts the electrodes 2,4 over a contact area with a width Δw which is smaller than the width w of the x electrode.

If the semiconductor material once more is provided over the memory cell in the form of a semiconductor patch, contact areas 11 as shown in FIG. 8a are obtained with a width Δw which only comprises a part of the width w of the x electrode 2. The active portion of the semiconductor 9 extends between the electrodes 2,4 in the contact areas 11. This embodiment corresponds to that in FIG. 5a. In the same manner it may in the semiconductor material 9 in FIG. 8b, which corresponds to the embodiment in FIG. 6, be provided a removed portion or window 17 such that there once more are obtained contact areas 11 with a width Δw which is less than the width w of the x electrode.

By now adjusting the geometrical form of respectively isolator patches 7, semiconductor patches 10 or the removed portions 8;17 in the isolating material 6 respectively the semiconductor material 9, the coding of data in a memory cell may take place in several levels.

It shall be understood that the patches 7,10 and the removed portions 8,17 may have a form which differs from that shown respectively in FIGS. 7a, b and 8a, b. It is for instance possible to pattern patches and removed portions such that the obtain the form of stripes respectively slots, but still are designed such that the contact areas 11 which provide the desired levels in a multivalued logical code, are obtained.

That the semiconductor material is provided over the electrode structures has a number of significant advantages. For the first electrode matrix and both the first isolating material 6 and the isolator strips 12 may be deposited by methods and equipment well-known in semiconductor technology, before the semiconductor layer is applied globally. Thus a number of adjustments may be performed with high precision in a sequence layer after layer over the same substrate and critical steps in the adjustment avoided, as it is not necessary to join the substrates 1 and 3 together in a sandwich configuration with high mutual positioning accuracy. For the second may the substrates with respectively the x electrodes and y electrodes 2;4 may be manufactured as semiproducts, i.e. without the isolating material 6 and the semiconductor material 9. Such semifinished blanks may be stored awaiting data coding and final processing. In the embodiment in FIG. 6 the substrates may for instance be fabricated in crystalline silicon. As known from NO patent application 973782; which is assigned to the present applicant, a monolithic structure may be chosen where active circuits which provide interconnections, logical functions,signal routing amplification etc. may be built into the silicon substrate and connected directly with the x and y electrodes on the same substrate. The whole construction apart from the uppermost semiconductor layer, may be completed in succeeding process steps which without difficulty may implemented by standard technologies for processing of semiconductors. The uppermost semiconductor layer is applied globally. The semiconductor material used must have suitable rectifying and conducting properties, while it is desirable with low bulk costs, simple processing, long lifetime etc. and must be such that optimal contact with the electrode structures is obtained. As semiconductor material may for instance conjugated polymers either of the PPV or tiophene type be suitable. Alternatively amorphous silicon or polycrystalline silicon may be used. A particularly simple and cheap solution is obtained when the semiconductor material is conjugated polymer which may be applied by doctor blading or by spin coating, dip coating or meniscus coating.

It shall here be remarked that coding of data with the use of multi-valued code places greater demand on discrimination when reading the impedance value in a memory cell, and if there is a present danger of bulk and sneak currents masking the impedance value signal, either the mutual distance between the electrodes 2,4 in each electrode structure and hence the memory cells 5 may be increased or else the multi-valued code may be employed with the embodiment variants shown in respectively FIG. 4b and FIG. 5b, which easily will allow the memory cells to be located with a greater area density and with maintenance of the discrimination necessary to obtain a readout of data stored for instance in a two-bit code, i.e. with two levels between the code level given by respectively a complete masking of the contact area in the memory cell and a complete exposure of the contact area in the memory cell. It is, however, supposed that it will be possible to increase the number of levels in the code, for instance using three- or four-bit coding. The latter is represented by sixteen levels and hence the realization will be a question of dimensions and attainable pitch if the manufacture of the memory cells takes place with conventional micro-photolithographic methods.

It may be expedient to form the semiconductor material from several semiconductors, for instance provided in layers, such as known in the art, in order to obtain special types of diodes, such as also known in the art, or in order to vary the impedance characteristics. For the same purpose also the semiconductor material may be combined with or added an electrical conducting material.

One or more read-only memories ROM according to the invention may advantageously be provided on a semiconductor substrate 1 of for instance silicon. In this substrate or integrated therewith in a compatible semiconductor technology there may be provided driver and control circuits 13 for the read-only memory. An embodiment with four read-only memories ROM provided for instance on a silicon substrate 1 with integrated driver and control circuits 13 is shown in FIG. 9.

Instead of providing the read-only memories in a planar configuration, they may also be stacked vertically in layers, such as is shown in FIG. 10. Once again the semiconductor substrate 1 of for instance silicon integrated with driver and control circuits 13, is used. Along the side edges of a stacked memory device of this kind there may be provided addressing and driver buses 14 and in order to connect the electrodes in the respective electrode structure, i.e. the electrode matrix, to the driver and control circuits in silicon substrates as this is indicated in FIG. 7 which shows an embodiment with stacked read-only memories ROM $15_l$ . . . $15_n$ which mutually are isolated by isolating layers $16_l$ . . . $16_n$, for instance ceramic.

Read-only memories and read-only memory devices according to the invention could advantageously be realized in card format compatible with standard interfaces as commonly used with personal computers. In practice the read-only memory realized in a read-only memory device may be implemented in known thin-film technology and the read-only memory device will integrated with the silicon substrate appear as hybrid device. In practice it has turned out that read-only memories according to the invention may be made with a thickness of electrode structures and memory cells of at most a few micrometers and with realistically at least two memory cells per $\mu m^2$ with the use of present technology. A read-only memory with one storage layer and an area of 1 $cm^2$ will hence store 25 Mbyte with binary coding. By using two- or four-bit coding, something which seems realistic, the data storage density may, of course, be correspondingly increased. It is assumed that it also will be realistic to reduce the size of the memory cells further such that a quadrupling of the storage density in this way may be achieved. It will hence be possible to store some hundred Mbytes in each read-only memory and the data storage density will, of course, increase proportionally with the number of stacked layers in a read-only memory device configured volumetrically.

Implemented with standard card interfaces for use in personal computers or in decoder devices for play-back equipment for reproducing sound and picture material it will hence be possible to employ the read-only memory according to the invention as data carrier for source material which else usually is stored on media such as CD-ROM.

Writing to the read-only memory according to the invention, i.e. input and coding of data, is implemented in and integrated with manufacturing processes. Preferably the read-only memory is manufactured with the use of well-known thin-film technologies and photolithographic methods. Basically all materials may be provided in global layers and electrode structures and patches and removed portions (windows) formed with the use of photomasks and etching. "Writing" of data then takes place by "coding" photomasks for patches or windows with positioning and dimensioning the patches or windows of the mask in accordance with a determined protocol, such that each memory cell is correctly coded. Processes of this kind may easily be implemented for manufacturing of large series of read-only memories with the same source information, for instance program material for music or films.

What is claimed is:

1. An electrically addressable non-volatile read-only memory, comprising:

a plurality of memory cells (5) which in a write operation comprising a part of the manufacturing process of the read-only memory, permanently each are assigned one or two or more logic states according to a determined protocol which in the memory defines permanently written or stored data, and a passive matrix of electrical conductors (2, 4) for the addressing;

wherein the passive electrical conductor matrix comprises a first and a second electrode structure in respective mutually spaced apart and parallel planes and with parallel electrodes (2, 4) in each plane and provided such that the electrodes form a substantially orthogonal x,y matrix;

wherein the electrodes (2) in the first electrode structure comprise the columns of the matrix or x electrodes and the electrodes (4) in the second electrode structure comprise the rows of the matrix or y electrodes;

wherein at least a portion of the volume between the intersection of an x electrode (2) and a y electrode (4) defines a memory cell (5) in the read-only memory;

wherein are provided at least one semiconductor material (9) with rectifying properties in relation to a selected electrical conducting electrode material and a first electrical isolating material (6);

wherein the semiconductor material (9) in electrical contact with an electrode (2, 4) in the memory cell forms a diode junction in the interface between semiconductor material and electrode material;

wherein a logic state in each case is given by the impedance value of the memory cell (5), said impedance value substantially being given by either the impedance characteristics of the semiconductor material or the impedance characteristics of the isolating material, and the impedance characteristic of the diode junction;

characterized in that the y electrodes (4) are provided on a second electrical isolating material (12) which is realized as strip-like structures of substantially same form and extension as the y electrodes (4) and provided adjacent to the x electrodes (2) as part of the matrix, that the semiconductor material is provided over the electrode structures, a contact area (11) in the memory cell (5) thus being defined by the portions which respectively extend along each side edge of the y electrode (4) where it overlaps the x electrode (2) in the memory cell (5), that a first logic state of a memory cell (5) in the read-only memory is generated by an active portion of the semiconductor material (9) covering the whole contact area (11) in the memory cell, the diode junction thus comprising the whole contact area of the memory cell, that a second logic state in a selected memory cell (5) in the read-only memory is generated by both electrode structures in the memory cell being covered by the first isolating material (6), that one or more additional logic states in a memory cell (5) in the read-only memory is generated by an active portion of the semiconductor material (9) covering only a part of the contact area (11), such that the data which are stored in the memory may be represented by the logic states in a binary or multi-valued code, and that said one or more additionally logic states are given by impedance values determined by the extension of the active portion of the semiconductor material, and the extension of the part of the contact area which forms the diode junction; and that a logic state in each case is given by the impedance value of the memory cell (5), said impedance value substantially being given by one or more of the following factors: the impedance characteristics of the semiconductor material, the impedance characteristics of the isolating material, the extension of the active portion of the semiconductor material, the extension of the part of the contact area which forms the diode junction, and the impedance characteristic of the diode junction.

2. A read-only memory according to claim 1, wherein the read-only memory constitutes a binary logic memory characterized in that the first logic state which either represents a logical 0 or a logical 1, is given by the effective forward bias resistance of a diode formed in a memory cell (5) wherein the semiconductor material (9) contacts both the x electrode (2) and the y electrode (4), and that the second or the additional logic state which correspondingly shall represent either a logical 1 or a logical 0, is given by a selected resistance value for the first isolating material (6) provided in a memory cell (5) wherein the semiconductor material (9) does not contact either the x electrode (2) or the y electrode (4).

3. A read-only memory according to claim 2, characterised in that the isolating material (6) in a memory cell (5) has an infinite resistance value.

4. A read-only memory according to claim 1, wherein the read-only memory is realized as a multilevel logic memory with two or more additional logic states, characterized in that the first logic state is given by the effective forward bias resistance of a diode formed in a memory cell (5) wherein the semiconductor material (9) contacts both the x and the y electrodes (2,4), and that the additional logic states are given by determined resistance values for the isolating material (6) provided in a memory cell (5) wherein the semiconductor material (9) at most contacts either the x electrode (2) or the y electrode (4) and the determined resistance value in each case lies between the effective forward bias resistance of a memory cell (5) formed with a diode, and infinite.

5. A read-only memory according to claim 1, characterized in that the first isolating material (6) in selected memory cells (5) is provided over the electrode structures in the form of a separate layer-like isolator patch (7) which wholly or partly covers the electrodes (2,4) in the memory cell (5), a selected memory cell dependent on the active portion of the semiconductor material and/or the diode junction area in the latter case acquiring a logic state which corresponds to a level in a multi-valued code.

6. A read-only memory according to claim 5, characterized in that the semiconductor material (9) is provided over the electrode structures in a global layer and besides over the isolator patches (7) in the selected memory cells (5).

7. A read-only memory according to claim 5, characterized in that the semiconductor material (9) is provided over the electrode structures and adjacent to the isolator patch (7) in the selected memory cells (5), such that the semiconductor material (9) and the isolator patches (7) mutually flush in a common continuous layer.

8. A read-only memory according to claim 1, characterized in that the first isolating material (6) is provided over the electrode structures in the form of a substantially global layer, and with removed portions (8) in selected memory cells (5), such that the removed portion wholly or partly exposes the electrodes (2, 4) in a selected memory cell (5), said memory cell dependent on the active portion of the semiconductor material (9) and/or the diode junction area in the latter case acquiring a logic state which corresponds to a level in a multi-valued code.

9. A read-only memory according to claim 8, characterized in that the semiconductor material (9) is provided over the electrode structures and over the isolating layer (6) in a global layer and besides contacts the electrode structures in the removed portions of the isolating layer (6).

10. A read-only memory according to claim 8, characterized in that the semiconductor material (9) is provided over the electrode structures and adjacent to the isolating layer (6) in the selected memory cells (5), such that the semiconductor material (9) and the isolating layer (6) mutually flush in a common continuous layer.

11. A read-only memory according to claim 1, characterized in that the semiconductor material (9) in selected memory cells (5) is provided over the electrode structures in the form of a separate layer-like semiconductor patch (10) which wholly or partly covers the electrodes (2,4) in the memory cell (5), a selected memory cell dependent on the active portion of the semiconductor material (9) and/or the diode junction area in the latter case requiring a logic state which corresponds to a level in the multivalued code.

12. A read-only memory according to claim 11, characterized in that the first isolating material (6) being provided over the electrode structures in a global layer and besides over the semiconductor patches (10) in the selected memory cells (5).

13. A read-only memory according to claim 11, characterized in that the first isolating material (6) is provided over the electrode structures and adjacent to the semiconductor patches (10) in the selected memory cells (11) such that the first isolating material (6) and the semiconductor patches (10) mutually flush in a common continuous layer.

14. A read-only memory according to claim 1, characterized in that the semiconductor material (9) is provided over the electrode structures in the form of a substantially global layer (9) and with removed portions (17) in selected memory cells (5), such that a removed portion (17) wholly or partly exposes the electrodes (2,4) in a selected memory cell (5), said memory cell dependent on the active portion of the semiconductor material and/or the diode junction area in the latter case acquiring a logic state which corresponds to a level in a multivalued code.

15. A read-only memory according to claim 14, characterized in that the first isolating material (6) is provided over the electrode structures and the semiconductor material (9) in a global layer and besides isolates the electrode structures in the removed portions (17) of the semiconductor layer (9).

16. A read-only memory according to claim 14, characterized in that first isolating material (6) is provided over the electrode structures and adjacent to the semiconductor layer (9) in the selected memory cells (5), such that the first isolating material (6) and the semiconductor layer (9) mutually flush in a common continuous layer.

17. A read-only memory according to claim 1, characterized in that the semiconductor material (9) is amorphous silicon.

18. A read-only memory according to claim 1, characterized in that the semiconductor material (9) is polycrystalline silicon.

19. A read-only memory according to claim 1, characterized in that the semiconductor material (9) is an organic semiconductor.

20. A read-only memory according to claim 19, characterized in that the organic semiconductor (9) is a conjugated polymer.

21. A read-only memory according to claim 1, characterized in that the semiconductor material (9) is an anisotropic conductor.

22. A read-only memory according to claim 1, characterized in that the semiconductor material (9) comprises more than one semiconductor.

23. A read-only memory according to claim 1, characterized in that the semiconductor material (9) has been added or combined with an electrical conducting material.

24. A read-only memory according to claim 1, characterized in that the semiconductor material (9), the isolating material (6) and the electrode structures are realized as thin films.

25. A read-only memory comprising one or more read-only memories (ROM) according to claim 1, characterized in that the read-only memory (ROM) is provided on a substrate (1) of semiconductor material or between substrates (1;3) of semiconductor material and via the substrates connected with driver and control circuits (13) for driving and addressing, said driving and control circuits (13) being integrated in the substrate (1) or the substrates (1;3) and realized in a semiconductor technology compatible with the substrate material.

26. A read-only memory comprising two or more read-only memories according to claim 1, characterized in that the read-only memory is stacked in layers in order to provide a volumetric memory device, that the volumetric memory device is provided on a substrate (1) of semiconductor material or between substrates (1;3) of semiconductor material and via the substrate or the substrates connected with driver and control circuits (13) for driving and addressing, said driving and control circuits (13) being integrated with the substrate (1) or the substrates (1;3) and realized in a semiconductor technology compatible with the substrate material.

* * * * *

UNITED STATES PATENT AND TRADEMARK OFFICE
CERTIFICATE OF CORRECTION

PATENT NO.    : 6,236,587 B1
DATED         : May 22, 2001
INVENTOR(S)   : Hans Gude Gudesen et al.

It is certified that error appears in the above-identified patent and that said Letters Patent is hereby corrected as shown below:

Under Assignee, insert -- THIN FILM ELECTRONICS ASA, Oslo, Norway --.

Under "Inventors:" change "Tyrihansvein" to -- Tyrihansveien --;
change "Båstradryggen" to --Båstadryggen --;
change "Jonsstubben" to -- Jongsstubben --.

Signed and Sealed this

Second Day of October, 2001

*Attest:*

NICHOLAS P. GODICI
*Attesting Officer*     *Acting Director of the United States Patent and Trademark Office*